United States Patent [19]
Takeuchi

[11] Patent Number: 5,185,584
[45] Date of Patent: *Feb. 9, 1993

[54] PHASE LOCKED LOOP (PLL) CIRCUIT HAVING ENHANCED FREQUENCY SELECTION RANGE

[75] Inventor: Kesatoshi Takeuchi, Suwa, Japan

[73] Assignee: Seiko Epson Corporation, Tokyo, Japan

[ * ] Notice: The portion of the term of this patent subsequent to Dec. 4, 2007 has been disclaimed.

[21] Appl. No.: 620,173

[22] Filed: Nov. 30, 1990

Related U.S. Application Data
[62] Division of Ser. No. 420,557, Oct. 11, 1989.

[51] Int. Cl.$^5$ .............................................. H03L 7/00
[52] U.S. Cl. ...................................... 331/25; 331/111; 331/177 R
[58] Field of Search ............... 331/18, 25, 108 R, 111, 331/143, 144, 177 R, 185, 186

[56] References Cited

U.S. PATENT DOCUMENTS
3,610,954  10/1970  Treadway ............................ 307/232
4,975,662  12/1990  Takeuchi ............................. 331/111

Primary Examiner—Robert J. Pascal
Attorney, Agent, or Firm—W. Douglas Carothers, Jr.

[57] ABSTRACT

A phase locked loop (PLL) circuit comprises a phase comparator, a low-pass filter, an error amplifier, and a voltage controlled oscillator (VCO) circuit which includes a current mirror circuit section and oscillator circuit section to provide an oscillation frequency based on the output current of the current mirror circuit section. To vary the oscillation over a wide range, a fixed reference voltage circuit is connected to the current mirror circuit, and either a source follower circuit made of a MOSFET or a FET or an emitter follower circuit made of a bipolar transistor is included is also connected to the current mirror circuit to selectively varying the output current of the current mirror circuit section upon application of a control voltage applied to the follower circuit. Thus, the follower circuit is controlled by a control voltage while the output current of the current mirror circuit varies depending on the magnitude of the control voltage, and, in turn, the oscillating frequency of the oscillator circuit section varies over a wide frequency range, e.g., in excess of 100 dB, in accordance with the output current.

6 Claims, 3 Drawing Sheets

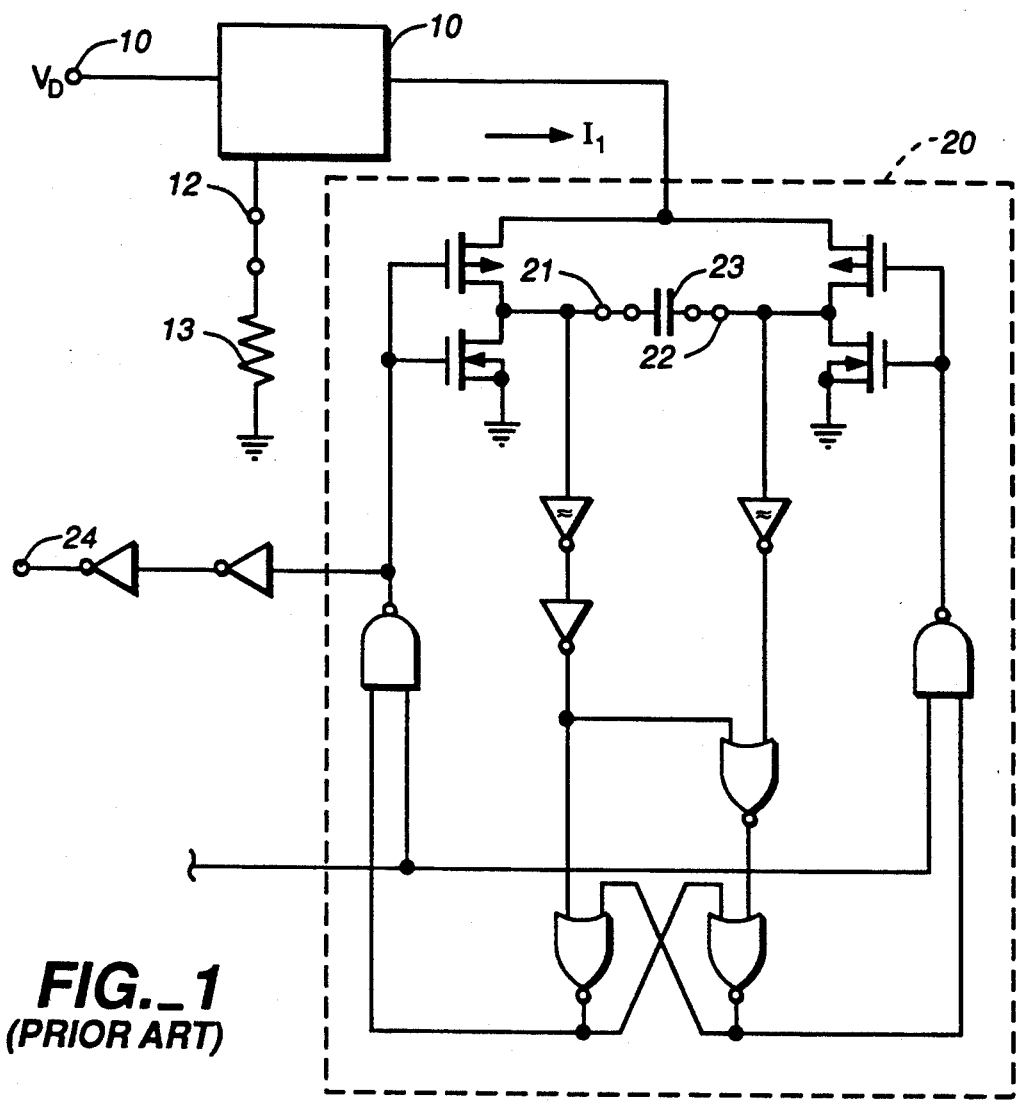
FIG._1
(PRIOR ART)
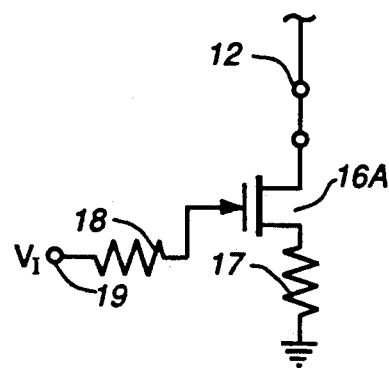
FIG._5A
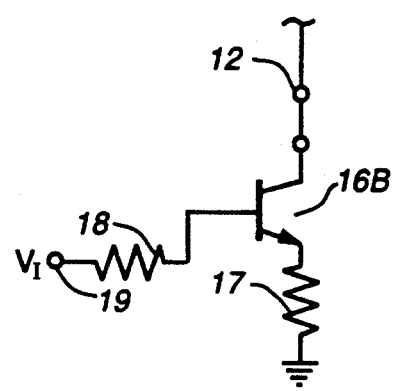
FIG._5B

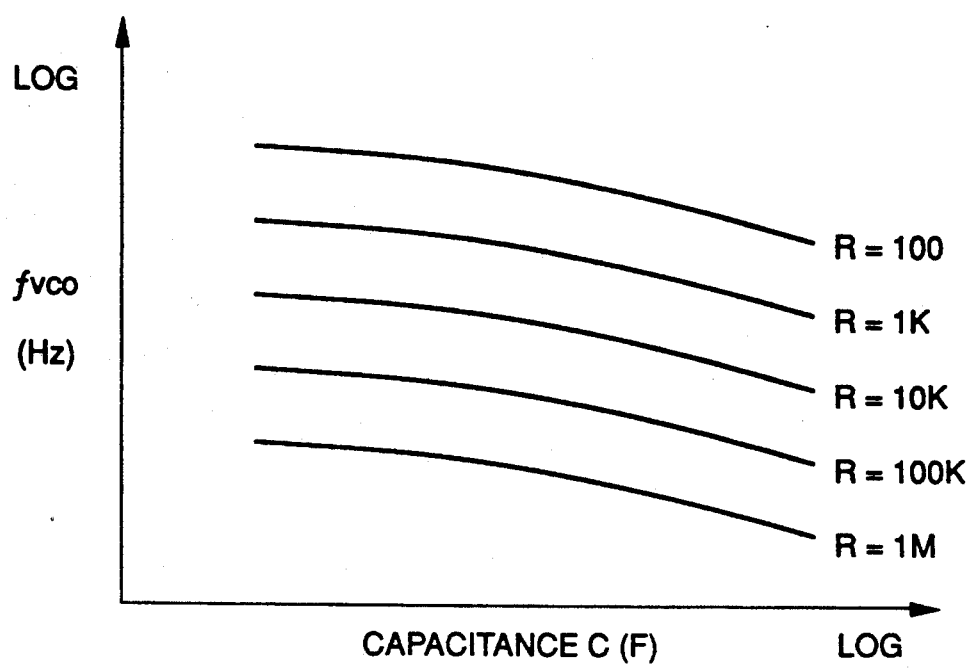
FIG._2
*(PRIOR ART)*
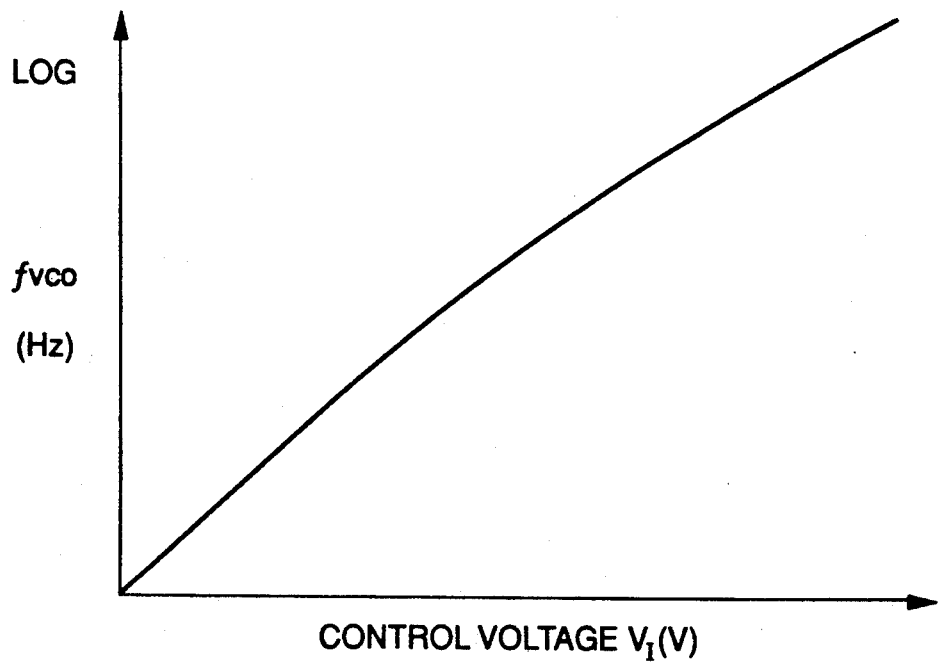
FIG._4

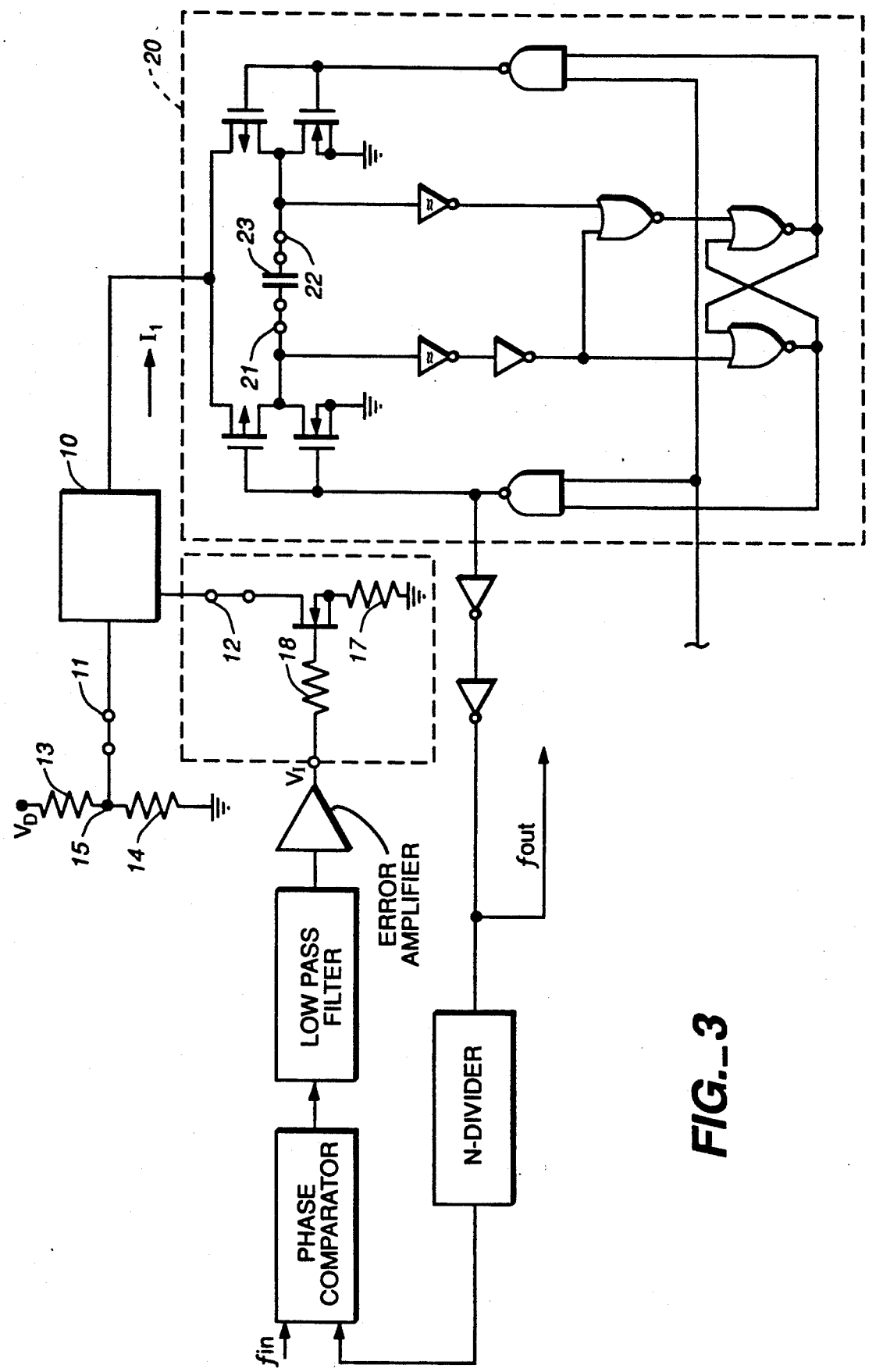
FIG._3

PHASE LOCKED LOOP (PLL) CIRCUIT HAVING ENHANCED FREQUENCY SELECTION RANGE

This is a division of application Ser. No. 07/420,557 filed on Oct. 11, 1989.

BACKGROUND OF THE INVENTION

This invention relates generally to a phased locked loop (PLL) circuit adapted for use in phase locked loop operation and more particularly to a phase locked loop (PLL) circuit having a VCO circuit that comprises a current mirror circuit section connected to an oscillator circuit section a provides an output having a selected frequency based upon the current output of the mirror circuit coupled as an input to the oscillator circuit and, in addition, provides means to control mirror circuit output current.

The phase locked loop (PLL) circuit is a circuit of the frequency feedback type comprising a phase comparator, a low-pass filter, an error amplifier, and a voltage controlled oscillator (VCO), which is adapted to generate a desired frequency in accordance with an externally applied signal. One such example is shown in FIG. 1, of my co-pending patent application Ser. No. 07/453,416 filed Dec. 19, 1989, entitled "Voltage Controlled Oscillator (VCO)." As well known in the art, the VCO is a circuit component indispensable to the operation of the PLL circuit.

FIG. 1 is an equivalent circuit diagram of a conventional VCO circuit employed in a PLL circuit, for example, the VCO circuit employed in chip MM74HC4046 manufactured by National Semiconductor Co., Ltd. Connection points 21, 22, 11 and 12 in FIG. 1 as well as in FIG. 3 respectively pin terminals numbered 6, 7, 9 and 11 for this particular chip MM74HC4046. This equivalent circuit is composed of a current mirror circuit section 10 and an oscillator section 20. To obtain an output current, $I_1$, from current mirror circuit section 10 corresponding to a desired frequecy characteristic, a resistor 13 is connected between pin terminal 12 of the current mirror circuit section 10 and ground. Further, a capacitor 23 for restriction of the oscillating frequency is connected between pin terminals 21 and 22 of oscillator section 20.

With resistor 13 and capacitor 23 connected as described above, a control voltage, $V_D$, is applied to input 11 at pin terminal 9 of the VCO circuit to selectively vary the frequency output thereof. As a result, the output current $I_1$ corresponding to the input control voltage, $V_D$, is supplied from current mirror circuit section 10 to oscillator circuit section 20 as a control current and oscillator circuit section 20 oscillates at a frequency corresponding to control current $I_1$. Therefore, an oscillating frequency signal having a desired frequency characteristic is provided as an output terminal 24 of the VCO circuit.

FIG. 2 is a frequency characteristic graph for the VCO circuit shown in FIG. 1. As will be appreciated from FIG. 2, the oscillating frequency, $f_{rco}$ varies depending on the capacitance, C, of capacitor 23 and the resistance, R, of resistor 13 and provides a variable frequency range on the order of 10 dB, extending from a few MHz to several tens of MHz. Thus, it can be seen that the range of frequency variation is quite narrow. To expand the variable range of frequency, both capacitor 23 and resistor 13 must themselves be changed, leading to the problem of requiring another circuit or other components having different values.

It is an object of the present invention to provide a phase locked loop (PLL) circuit incorporating a VCO circuit capable of selectively extending the range of frequency variation by the addition of a simple circuit configuration.

SUMMARY OF THE INVENTION

According to this invention, a phase locked loop (PLL) circuit comprises a phase comparator, a low-pass filter, an error amplifier, and a voltage controlled oscillator (VCO) wherein a fixed reference voltage circuit is connected to an input terminal of the current mirror circuit of the VCO circuit and includes either a source follower circuit comprising a MOSFET or a FET, or an emitter follower circuit comprising a bipolar transistor included in such a circuit. The follower circuit is employed to selectively varying the output current of the current mirror circuit so that the oscillating frequency of the oscillator section is selectively controlled over a wide range of frequencies. The selection is accomplished by controlling the voltage input to the follower circuit. The selection of the oscillating frequency is, therefore, controlled by selectively applying a control voltage to the follower circuit.

Thus, in the present invention, the follower circuit is controlled by a control voltage while the output current of the current mirror circuit varies depending on the magnitude of the control voltage, and, in turn, the oscillating frequency of the oscillator circuit section varies over a wider range in accordance with the output current.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a circuit diagram showing a conventional VCO circuit.

FIG. 2 is a graphic representation of capacitance-frequency characteristics of the VCO circuit of FIG. 1.

FIG. 3 is a circuit diagram illustrating an embodiment of a VCO circuit according to the present invention;

FIG. 4 is a graphic illustration of a voltage-frequency characteristics of the VCO circuit of FIG. 3.

FIGS. 5A and 5B are circuit diagrams illustrating particular alternative embodiments for the VCO circuit according to the present invention.

DESCRIPTION OF THE PREFERRED EMBODIMENTS

Reference is now made to FIG. 3 illustrating an embodiment of a VCO circuit in the PLL circuit according to the present invention. This embodiment has been employed in connection with the VCO circuit provided in the chip MM74HC4046 manufactured by National Semiconductor Co., Ltd.

The same reference numerals employed in FIG. 1 are employed for the same or corresponding components in FIG. 3 so that their description need not be repeated here.

In FIG. 3, the connecting point 15 of resistors 13 and 14 is connected to input terminal 11 of the VCO circuit so that a fixed reference voltage, determined by the ratio of voltage division of these resistors, is applied to input terminal 11. To obtain a selected output current, $I_1$ from current mirror circuit section 10, MOSFET 16 is provided to form a source follower circuit in such a manner that the drain of MOSFET 16 is connected to terminal 12 and the source of MOSFET 16 is connected to resistor 17 and resistor 17 is connected to ground. Further, a gate resistor 18 is connected between the gate of MOSFET 16 and voltage control input 19. A control voltage, $V_I$, is applied to input 19 to selectively vary control current, $I_1$.

In this configured VCO circuit, when control voltage, $V_I$, is applied to voltage control input 19, the magnitude of the drain current of MOSFET 16 flows in accordance with control voltage, $V_I$, applied to its gate. Thus, a source follower circuit is formed whose impedance, as viewed from the side of the terminal 12, varies in accordance with control voltage, $V_I$. Consequently, the output current, $I_1$, of current mirror circuit section 10 varies in accordance with the source follower circuit impedance. With output current, $I_1$, applied to the oscillator circuit section 20 as a control current, oscillator circuit section 20 oscillates at an oscillation frequency corresponding to control current, $I_1$. Accordingly, a signal having the corresponding oscillation frequency is provided at output 24.

FIG. 4 is a voltage-frequency characteristic graph for the VCO circuit shown in FIG. 3. As will be appreciated from FIG. 4, a selected frequency signal is established exclusively through control voltage, $V_I$, at input 19, whose frequency variable range is on the order of more than 100 dB, extending from a few Hz to several tens of MHz, which wide variable range is not obtainable with VCO circuits of the prior art.

FIG. 5A discloses another embodiment for the source follower circuit employing FET 16 in place of the MOSFET 16 of FIG. 3. FIG. 5B discloses a further embodiment comprising emitter follower circuit employing bipolar transistor 16B in place of MOSFET 16 of FIG. 3. In the case of either the FIG. 5A or 5B embodiment, the same effect is achieved relative to voltage control of output current, $I_1$, as discussed relative to the FIG. 3 embodiment, resulting in a wider range of frequency operation for the VCO circuit.

It should be noted that the present invention may be equally applied to other types of circuits requiring a wide range of frequency selection as well as the particular VCO circuit of the specifically exemplified chip previously referred to herein.

In summary, a source follower circuit comprising a MOSFET or a FET or a emitter follower circuit comprising a bipolar transistor is included as input to the current mirror circuit section of a VCO circuit for varying the output current of the current mirror circuit so that the oscillating frequency of the oscillator circuit section is selectively controlled over a wide range of frequencies via controlling the voltage input to the source follower circuit or the emitter follower circuit, as case may be. Further, even where the present invention is applied to a conventional VCO circuit comprising an IC element, the number of additional components is very small. Accordingly, the present invention is very advantageous in enhancing the performance of a PLL, circuit without added complexity or accompanied with any significant increase in costs.

While the invention has been described in conjunction with several specific embodiments, it is evident to those skilled in the art that many further alternatives, modifications and variations will be apparent in light of the forgoing description. Thus, the invention described herein is intended to embrace at such alternatives, modifications, applications and variations as fall within the spirit and scope of the appended claims.

What is claimed is:

1. A phase locked loop circuit of the frequency feedback type having enhanced frequency selection range comprising a phase comparator, a low-pass filter, an error amplifier, and a voltage controlled oscillator, said voltage controlled oscillator circuit including a current mirror circuit section and an oscillator circuit section for providing an oscillating frequency based on the output current of the current mirror circuit coupled as an input to said oscillator circuit section, circuit control means in said current mirror circuit section to control said output current based upon a control voltage applied as its input, the improvement comprising a fixed reference voltage applied to said current mirror circuit section in combination with a follower circuit connected as an input to said circuit control means for varying the output current thereof to said oscillator circuit section, the frequency output of said oscillator circuit section selectively controlled over a wider range of frequencies by selectively controlling the magnitude of said control voltage applied to said follower circuit input.

2. The phase lock looped circuit according to claim 1, wherein said follower circuit is a source follower circuit comprising either a MOSFET or FET and said MOSFET or FET is controlled by a control voltage ($V_I$).

3. The phase lock looped circuit according to claim 1, wherein said oscillator circuit includes a capacitor whose value determines the oscillating frequency output of said circuit.

4. A phase locked loop circuit of the frequency feedback type comprising a phase comparator, a low-pass filter, an error amplifier, and a voltage controlled oscillator, said voltage controlled oscillator circuit having a current mirror circuit and an oscillator circuit wherein the current output from said current mirror circuit is provided as an input to said oscillator circuit to produce an output fequency based upon an input voltage to said current mirror circuit, a voltage input circuit in said current mirror circuit to receive said input voltage to control said current output and provide a selected frequency output from said oscillator circuit based upon a change in said voltage input, the improvement comprising at least one follower circuit coupled to the input of said voltage input circuit and having an input to receive said input voltage extending the range of frequencies capable of being provided at said oscillator circuit output.

5. The phase locked loop circuit according to claim 4, wherein said voltage input circuit comprising a follower circuit which is a source follower circuit comprising either a MOSFET or FET and is controlled by a control voltage ($V_I$).

6. The phase lock looped circuit according to claim 4, wherein said oscillator circuit includes a capacitor whose value determines the oscillating frequency output of said circuit.

* * * * *